United States Patent [19]

Keats et al.

[11] 4,192,013

[45] Mar. 4, 1980

[54] SAFETY CIRCUITS FOR COUPLING LADDICS IN CASCADE

[75] Inventors: Albert B. Keats, Dorchester; Dudley W. Leggett, Weymouth, both of England

[73] Assignee: United Kingdom Atomic Energy Authority, London, England

[21] Appl. No.: 911,631

[22] Filed: Jun. 1, 1978

Related U.S. Application Data

[63] Continuation of Ser. No. 708,228, Jul. 23, 1976, abandoned.

[30] Foreign Application Priority Data

Jul. 24, 1975 [GB] United Kingdom ............... 31063/75
Dec. 2, 1975 [GB] United Kingdom ............... 49445/75

[51] Int. Cl.² ............................................. G11C 11/08
[52] U.S. Cl. ..................................... 365/91; 365/206
[58] Field of Search .................. 365/91, 140, 144, 90, 365/206

[56] References Cited

U.S. PATENT DOCUMENTS

| | | | |
|---|---|---|---|
| 2,976,472 | 3/1961 | Newhall et al. | 365/91 |
| 3,229,267 | 1/1966 | Engelbart et al. | 365/89 |
| 3,343,146 | 9/1967 | Walker | 365/140 |
| 3,459,958 | 8/1969 | Schulz | 365/140 |
| 3,737,775 | 6/1973 | Mangold et al. | 365/140 |

OTHER PUBLICATIONS

Bell System Technical Journal—vol. 38, No. 1, 1959, pp. 45–72.
British Communications & Electronics—Mar. 1962, pp. 180–184.

*Primary Examiner*—James W. Moffitt
*Attorney, Agent, or Firm*—Larson, Taylor and Hinds

[57] ABSTRACT

A coupling arrangement for coupling laddics in cascade comprises an emitter follower transistor circuit arranged so that the output impedance of the transistor restricts the rise and fall times in the mmf of the laddic output winding. The effect is to reduce the risk of spurious reset signals being generated in the output winding of sufficient amplitude to reset the next laddic in the cascade.

2 Claims, 3 Drawing Figures

SAFETY CIRCUITS FOR COUPLING LADDICS IN CASCADE

This is a continuation of application Ser. No. 708,228 filed July 23, 1976 now abandoned.

BACKGROUND OF THE INVENTION

This invention relates to safety circuits and the like which make use of multi aperture ferrite components such as those known as laddics. Laddics in common with other like devices exploit the square or, more accurately, the trapezoidal shape of their magnetisation characteristic by the application of alternate mmf pulses of opposite sign to windings embracing spaced legs of the laddic so that magnetic flux changes induced in the ferrite may be detected by an output winding in terms of an emf. Further control windings may be employed on the ferrite legs between the input and output windings so that the laddic may act as a logic gate in which a flux reversal in ferrite beneath the output winding is inhibited unless the required control winding inputs are present. Because the existence of an output signal may be made dependent upon the maintenance of separate pulsed inputs on the other windings the device is normally failsafe and finds application in safety circuits, for the output, which itself is a pulse train, will not appear if any one input or control signal fails to switch the magnetic flux in its underlying portion of the ferrite.

Should there be a failure and the ferrite which is beneath the output winding fail to be switched from a certain saturation point, the magnetic flux will fall from saturation to remnance by natural decay. Although the flux change over this part of the B-H loop is very small indeed compared to a full flux reversal, it can occur at a very much faster rate. Unless precautions are taken the amplitude of the voltage induced in the output winding as a result of this small but fast flux change can be quite comparable to a full flux change. Such a possibility cannot be tolerated in a circuit of high reliability as in a safety circuit and in these circuits laddics are coupled in cascade with the object that an output pulse from the output winding of the first laddic serves to reset the flux in the second laddic. In this context a spurious output pulse is termed reset noise for the amplitude of the noise may be sufficient for the signal to reset the next laddic. This weakness has in the past been compensated for by the use of a coupling circuit between cascaded laddics which includes a transistor having a low cut off frequency. However these transistors are becoming obsolete and the present tendency is for the trade to market planar transistors with high cut off frequencies.

An object of the present invention is to produce a means whereby the risk of spurious output signals from the output winding of a laddic is reduced and allowes a planar transistor to be employed to couple laddic devices in cascade.

SUMMARY OF THE INVENTION

According to the present invention there is provided an electric circuit including a laddic component, an output winding on the laddic component, the output winding forming part of an emitter follower transistor circuit arranged so that the output impedance of the transistor restricts the rise and fall times of the mmf in the output winding.

Preferably the laddic leg next to that carrying the output winding bears a further winding in series opposition with the output winding so as to generate a compensating emf to limit noise signals in the output winding when the flux in the ferrite drops from saturation to remnance.

DESCRIPTION OF THE DRAWINGS

The invention will now be described in its application to laddics connected in cascade with reference to the accompanying drawings in which.

DESCRIPTION OF THE PREFERRED EMBODIMENT

Figure 1:
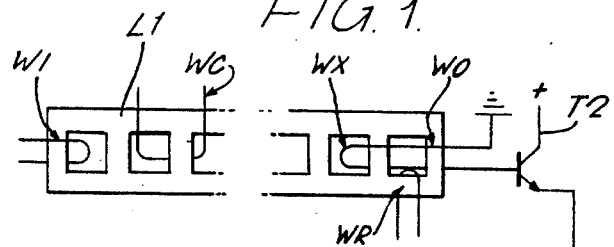
FIG. 1 is a circuit diagram of a preferred embodiment of the present invention wherein compensation is provided for reset noise generated in the coupling circuit between two laddics connected in cascade.

Referring to the drawings there is shown the elements of a coupling circuit between two laddics L1 and L2 connected in cascade. The laddics each comprise a ferrite strip having a single row of similar apertures separated by legs or rungs. The legs or some of them carry windings which are shown as single loops and these include an input, or set, winding W1, a reset winding WR and an output winding WO the latter being applied to a leg remote from the input winding W1. Between windings $W_I$ and WR are a number of control, or hold windings WC but these are not directly the concern of the present invention which as previously stated is directed to the reduction of reset noise generated in output winding WO. There are two aspects to the means for compensating for reset noise, namely, the use of an opposition winding WX on the penultimate leg of the laddic L1 in series with winding WO and the use of an emitter follower planar transistor T2 in the coupling circuit.

Figure 2A:
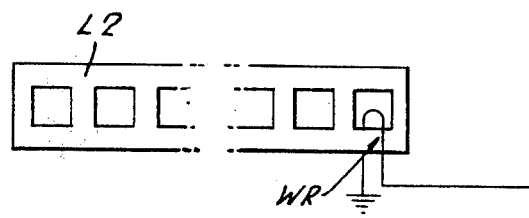
FIGS. 2A and 2B are explanatory diagrams and show prior art.
Figure 2A:
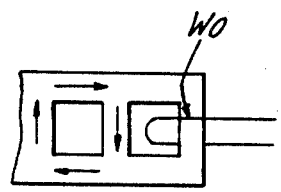
Figure 2B:
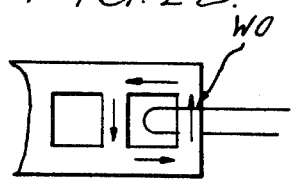

As will be known in normal operation of a laddic L1 the input winding W1 and the reset WR receive pulses of opposite sign and these are phased to set up alternate mmf's in the underlying ferrite and a consequential continuous switching of the direction of the saturated magnetic flux in the ferrite from positive to negative side of the B H loop results. This flux change is detected in the ferrite beneath the output winding Wo as an emf and can be used to produce a reset current in the next laddic L2. The conventional way of detecting these flux reversals, as indicated by FIGS. 2A and 2B in which the flux reversals are indicated by arrows, is by the winding WO embracing the ultimate legs of the laddic. The singular winding WO was connected into a coupling circuit which included a grounded emitter transistor amplifier having a low cut off frequency. See for example British Communications and Electronics, March 1962, page 181, FIG. 4(a). It will be observed that the flux in the penultimate leg appears to preserve a constant direction and does not contribute to reset noise. By extending the winding WO so that it embraces the penultimate leg as an additional winding WX in series opposition to the winding WO, then if and when the magnetic flux falls from saturation to remnance an emf will be generated in the WX which opposes that generated in the winding WO and a partial cancellation of reset noise will be obtained.

A further measure which enhances immunity from reset noise appearing in the coupling between laddics is the provision of an emitter follower transistor coupling circuit. This coupling circuit inclues a contemporary planar npn transistor T2 used in the emitter follower configuration; when positive pulses are supplied to the base the transistor conducts and current flows to the reset winding of the second laddic L2 with in-phase pulses. These current pulses generate a reset mmf and the rise and fall times of which are governed by the output impedance of the emitter-follower coupling transistor and the reset winding inductance in L2 unlike the case of the common emitter transistor coupling used hitherto. With a common emitter transistor the mmf rise time was governed by the transistor turn-on time and by the time constant of the Reset-current-defining resistance and the Reset winding inductance; the mmf fall time of the Reset mmf being extremely short at transistor switch off and the fall of mmf being limited only by the natural rate of decay of the magnetic flux from saturation to remnance. In contrast when the emitter follower transistor turns off its base-emitter junction is forward biased and begins to conduct so limiting the back emf generated across the driven Reset winding in L2. Hence the rate of fall of Reset mmf is controlled and on the trailing edge of the Reset mmf pulse, the resulting rate of change of flux is small, too small to generate a spurious Reset noise emf. Also the compensated output winding provides partial cancellation of any noise emf generated as the flux decays from saturation to remnance due to opposite senses of the flux changes in the penultimate and final rungs of the laddic L1.

We claim:

1. An electric circuit comprising a first laddic component, a second laddic component, and a coupling circuit connecting together the first and the second laddic components in cascade, wherein the improvement comprises,
    (a) a transistor connected as an emitter follower;
    (b) an output winding of the first laddic component extending across an end leg of said first laddic component and a leg adjacent said end leg, said output winding having one end thereof connected to the base of said transistor and the other end thereof grounded, and
    (c) a reset winding of the second laddic component, said reset winding having one end connected to the emitter of said transistor and the other end thereof grounded such that when the magnetic flux in the first laddic component falls from saturation of remanence, reset noise in the coupling circuit is substantially reduced.

2. An electric circuit comprising a first laddic component, a second laddic component, and a coupling circuit for coupling the first and the second laddic components in cascade and including an emitter follower transistor, an output winding of the first laddic component which extends across an end leg of said first laddic component and a leg adjacent said end leg and is connected to the base of said transistor, and a reset winding of the second laddic component connected to the emitter of said transistor such that when the magnetic flux in the first laddic component falls from saturation to remanence reset noise in the coupling circuit is substantially reduced.

* * * * *